US012634641B2

(12) United States Patent
Smieja et al.

(10) Patent No.: US 12,634,641 B2
(45) Date of Patent: May 19, 2026

(54) REDUCING COMB FILTERING FOR HEARING DEVICES

(71) Applicant: Starkey Laboratories, Inc., Eden Prairie, MN (US)

(72) Inventors: Daniel A. Smieja, Minneapolis, MN (US); Masahiro Sunohara, Plymouth, MN (US); Terence Betlehem, Eden Prairie, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 179 days.

(21) Appl. No.: 18/610,852

(22) Filed: Mar. 20, 2024

(65) Prior Publication Data

US 2024/0323618 A1 Sep. 26, 2024

Related U.S. Application Data

(60) Provisional application No. 63/491,570, filed on Mar. 22, 2023.

(51) Int. Cl.
H04R 25/00 (2006.01)
H03H 17/02 (2006.01)
(Continued)

(52) U.S. Cl.
CPC ....... H04R 25/505 (2013.01); H03H 17/0213 (2013.01); H03H 17/025 (2013.01);
(Continued)

(58) Field of Classification Search
CPC ............. H04R 25/505; H04R 2460/01; H03H 17/0213; H03H 17/025; H03H 17/04; H03H 17/06
See application file for complete search history.

(56) References Cited

U.S. PATENT DOCUMENTS 8,229,127 B2 7/2012 Jorgensen et al.
2019/0356990 A1* 11/2019 Arnold ................. H04R 25/356

FOREIGN PATENT DOCUMENTS

EP 2519033 12/2017
EP 3681175 6/2022

OTHER PUBLICATIONS

Hirano, Kotaro, "Design of Digital Notch Filters", IEEE Transactions on Communications, vol. 72, Issued 7, 07 1974, 7 pgs.
(Continued)

*Primary Examiner* — Tuan D Nguyen
(74) *Attorney, Agent, or Firm* — Schwegman Lundberg & Woessner, P.A.

(57) ABSTRACT

Disclosed herein, among other things, are systems and methods for reducing the comb filtering for hearing devices. A method includes determining an effective time delay as a function of frequency between a direct path from a sound source to an eardrum of a wearer of a hearing device and an amplified path from the sound source through the hearing device to the eardrum of the wearer, and calculating a set of cancellation frequencies based at least in part on the determined effective time delay. The method also includes comparing an aided gain response and a real-ear occluded gain response of the hearing device, and determining one or more spectral interaction regions based at least in part on the comparison. A subset of cancellation frequencies is determined by comparing the spectral interaction regions with the set of cancellation frequencies, and a filter is constructed using the subset of cancellation frequencies and a determined attenuation configured to reduce comb filtering.

20 Claims, 6 Drawing Sheets

(51) Int. Cl.
　　　 *H03H 17/04* 　　　　　(2006.01)
　　　 *H03H 17/06* 　　　　　(2006.01)
(52) U.S. Cl.
　　　 CPC ............ *H03H 17/04* (2013.01); *H03H 17/06*
　　　　　　　　 (2013.01); *H04R 2460/01* (2013.01)

(56) 　　　　　　　 References Cited

OTHER PUBLICATIONS

Schafer, Ronald W, "Discrete-Time Signal Processing", United Kingdom Pearson, 2010, 106 pgs.

* cited by examiner

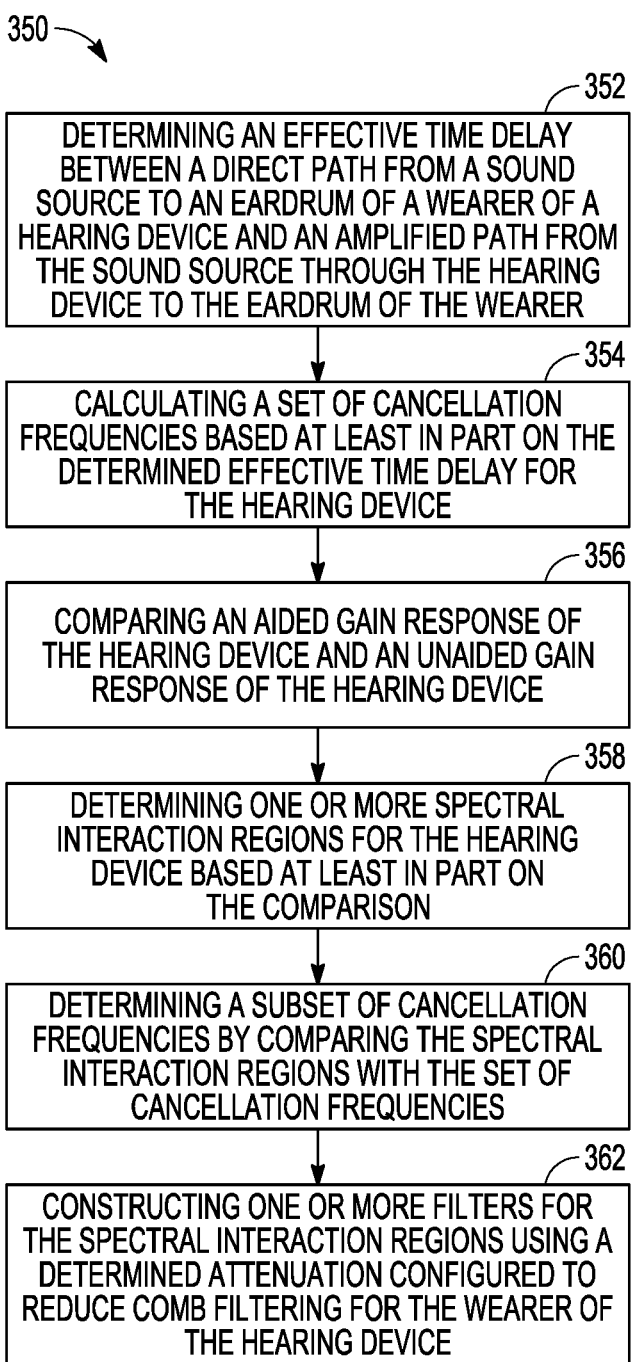

350

352
DETERMINING AN EFFECTIVE TIME DELAY BETWEEN A DIRECT PATH FROM A SOUND SOURCE TO AN EARDRUM OF A WEARER OF A HEARING DEVICE AND AN AMPLIFIED PATH FROM THE SOUND SOURCE THROUGH THE HEARING DEVICE TO THE EARDRUM OF THE WEARER

354
CALCULATING A SET OF CANCELLATION FREQUENCIES BASED AT LEAST IN PART ON THE DETERMINED EFFECTIVE TIME DELAY FOR THE HEARING DEVICE

356
COMPARING AN AIDED GAIN RESPONSE OF THE HEARING DEVICE AND AN UNAIDED GAIN RESPONSE OF THE HEARING DEVICE

358
DETERMINING ONE OR MORE SPECTRAL INTERACTION REGIONS FOR THE HEARING DEVICE BASED AT LEAST IN PART ON THE COMPARISON

360
DETERMINING A SUBSET OF CANCELLATION FREQUENCIES BY COMPARING THE SPECTRAL INTERACTION REGIONS WITH THE SET OF CANCELLATION FREQUENCIES

362
CONSTRUCTING ONE OR MORE FILTERS FOR THE SPECTRAL INTERACTION REGIONS USING A DETERMINED ATTENUATION CONFIGURED TO REDUCE COMB FILTERING FOR THE WEARER OF THE HEARING DEVICE

FIG. 3B

REDUCING COMB FILTERING FOR HEARING DEVICES

CROSS-REFERENCE TO RELATED APPLICATION

This patent application claims the benefit of U.S. Provisional Patent Application No. 63/491,570, filed Mar. 22, 2023, which is incorporated by reference herein in its entirety.

TECHNICAL FIELD

This document relates generally to hearing device systems and more particularly to reducing the comb filtering for hearing devices.

BACKGROUND

Examples of hearing devices, also referred to herein as hearing assistance devices or hearing instruments, include both prescriptive devices and non-prescriptive devices. Specific examples of hearing devices include, but are not limited to, hearing aids, headphones, assistive listening devices, and earbuds.

Hearing aids are used to assist patients suffering hearing loss by transmitting amplified sounds to ear canals. In one example, a hearing aid is worn in and/or around a patient's ear. Hearing aids may include processors and electronics that improve the listening experience for a specific wearer or in a specific acoustic environment.

The superposition of sound processed through a hearing aid and the direct path sound leaking into the ear canal can cause comb filtering. Hearing aid wearers often perceive comb filtering as unnatural or as environment distortions. Improved methods of reducing comb filtering for hearing devices are needed.

SUMMARY

Many hearing aids, including receiver-in-the-canal (RIC) and other custom devices, include venting, either through an open earbud or a channel that connects the ear canal to the outside air. While providing several benefits, this venting also provides a direct path for sound to travel to the eardrum of the wearer, where it interferes with the amplified or aided sound produced by the hearing aid. Since the amplified or aided sound includes a path through the electronics of the hearing aid, the amplified or aided sound is delayed with respect to the direct sound, and the sum of the sounds from the two paths produces comb filtering which may cause distortion or discomfort and thereby degrade the sound quality for the wearer.

Disclosed herein, among other things, are systems and methods for reducing comb filtering for hearing devices. A method includes determining an effective time delay between a direct path from a sound source to an eardrum of a wearer of a hearing device and an amplified path from the sound source through the hearing device to the eardrum of the wearer, and calculating a set of cancellation frequencies based at least in part on the determined effective time delay for the hearing device. The method also includes comparing an aided gain response of the hearing device and a direct path gain response (or real-ear occluded gain) of the hearing device, and determining one or more spectral interaction regions for the hearing device based at least in part on the comparison. A subset of cancellation frequencies are identified within the one or more spectral interaction regions based upon properties of the comb filtering effect, and a filter for the one or more spectral interaction regions is constructed using the subset of cancellation frequencies and a determined attenuation configured to reduce comb filtering for the wearer of the hearing device.

Various aspects of the present subject matter include a system including a computing device comprising at least one processor and a data storage device in communication with the processor, wherein the data storage device comprises instructions thereon that, when executed by the at least one processor, causes the at least one processor to determine an effective time delay between a direct path from a sound source to an eardrum of a wearer of a hearing device and an amplified path from the sound source through the hearing device to the eardrum of the wearer, calculate a set of cancellation frequencies based at least in part on the determined effective time delay for the hearing device, compare an aided gain response of the hearing device and a direct path gain response (or real-ear occluded gain) of the hearing device, determine one or more spectral interaction regions for the hearing device based at least in part on the comparison, determine a subset of cancellation frequencies within the one or more spectral interaction regions, and construct one or more filters for using a determined attenuation configured to reduce comb filtering for the wearer of the hearing device.

This Summary is an overview of some of the relevant aspects of the present application and not intended to be an exclusive or exhaustive treatment of the present subject matter. Further details about the present subject matter are found in the detailed description and appended claims.

BRIEF DESCRIPTION OF THE DRAWINGS

Various embodiments are illustrated by way of example in the figures of the accompanying drawings. Such embodiments are demonstrative and not intended to be exhaustive or exclusive embodiments of the present subject matter.

FIGS. 3A-3B illustrate flow diagrams of methods for reducing comb filtering for hearing device applications, according to various examples of the present subject matter.

DETAILED DESCRIPTION

The following detailed description of the present subject matter refers to subject matter in the accompanying drawings which show, by way of illustration, specific aspects and examples in which the present subject matter may be practiced. These examples are described in sufficient detail to enable those skilled in the art to practice the present subject matter. References to "an", "one", or "various" examples or embodiments in this disclosure are not necessarily to the same embodiment, and such references contemplate more than one embodiment. The following detailed description is demonstrative and not to be taken in a limiting sense. The scope of the present subject matter is defined by the appended claims, along with the full scope of legal equivalents to which such claims are entitled.

The present detailed description will discuss hearing devices generally, including earbuds, headsets, headphones and hearing assistance devices using the example of hearing aids. Other hearing devices include, but are not limited to, those in this document. It is understood that their use in the description is intended to demonstrate the present subject matter, but not in a limited or exclusive or exhaustive sense.

The superposition of sound processed through a hearing aid and the direct path sound leaking into the ear canal can cause comb filtering. The comb filtering is mainly affected by hearing aid gain and compression ratios (which relate to an individual's hearing loss profile), hearing aid latency and acoustic vent diameter and length of the hearing aid. Hearing aid wearers often perceive comb filtering as unnatural, artificial sounding, or as environment distortions.

Figure 1:
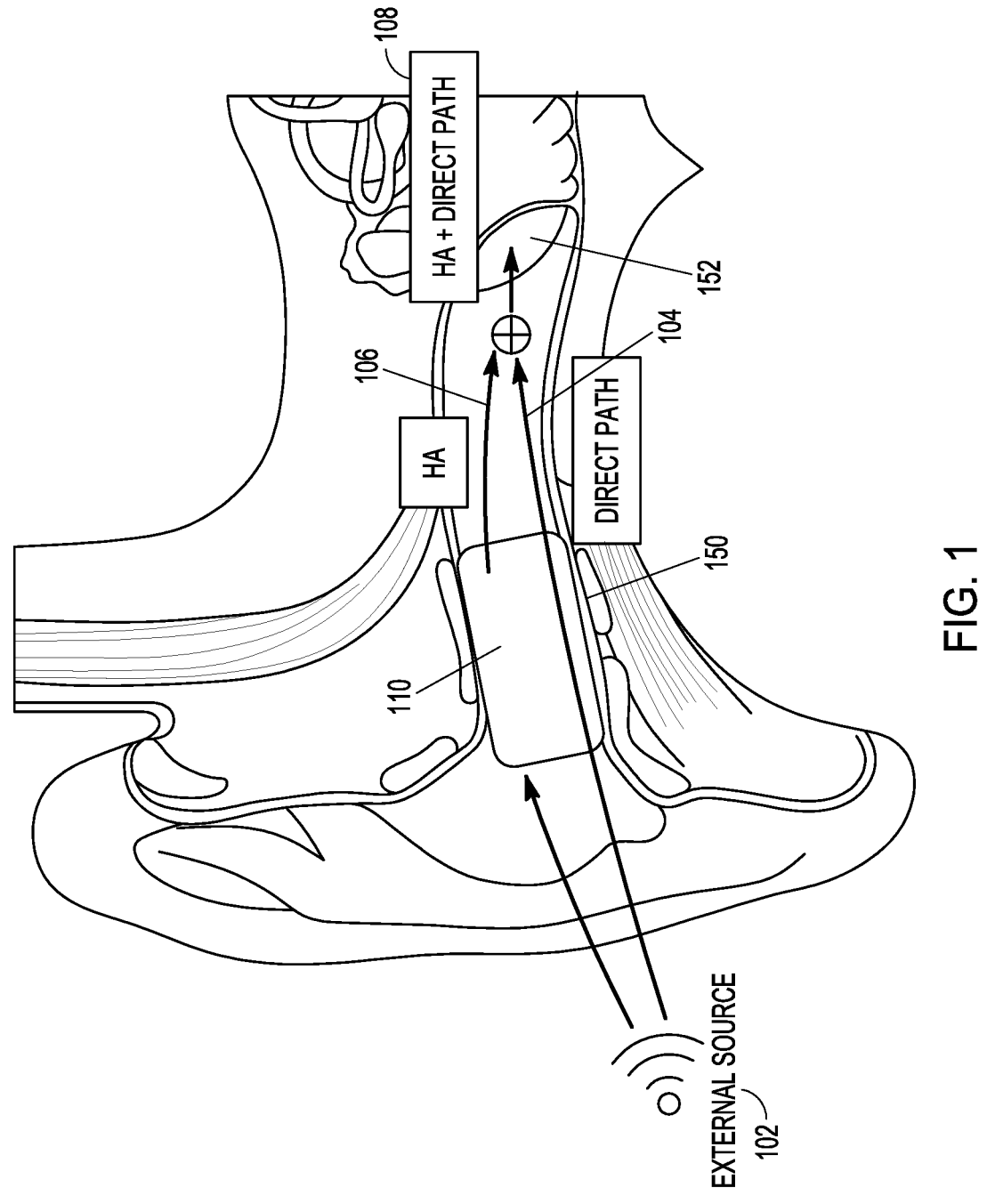
FIG. 1 illustrates a hearing device providing direct and amplified sound paths to an eardrum of a wearer of the hearing device.

FIG. 1 illustrates a hearing device 110 providing direct 104 and amplified 106 sound paths to an eardrum 152 of a wearer of the hearing device. The depicted hearing device 110 at or near an ear canal 150 of the wearer includes an open ear bud or other venting providing a direct path 104 for sound to travel from an external source 102 to the eardrum 152 of the wearer, where it interferes with amplified or aided sound (indirect or amplified path 106) produced by the hearing aid in a combined path 108. Since the amplified or aided sound includes a path through the electronics of the hearing aid which includes digital signal processing, the amplified or aided sound is delayed with respect to the direct sound, and the sum of the sounds from the two paths (combined path 108) produces a comb filtering which may cause distortion or discomfort and thereby degrade the sound quality for the wearer.

The present subject matter provides systems and methods for reducing comb filtering for hearing devices. The systems and methods provide a robust mitigation technique to address comb filtering caused by the hearing-aid processing delay, by reducing the gain in narrow interfering spectral regions where maximum cancellation is predicted. In various examples, the system of the present subject matter determines time delay, which is a function of frequency, uses the time delay to predict a set of cancellation frequencies spanning the whole bandwidth of the hearing device, determines one or more spectral interaction regions of the bandwidth where the direct path and the amplified path are within X dB (to determine where significant cancellation could occur), determines a subset of the cancellation frequencies that intersect the predicted set and the one or more spectral interaction regions, and applies a set of narrow filters at the subset of cancellation frequencies to reduce comb filtering. In some examples, X may be between 6 and 20 dB. Other values of X may be used without departing from the scope of the present subject matter.

Figure 2A:
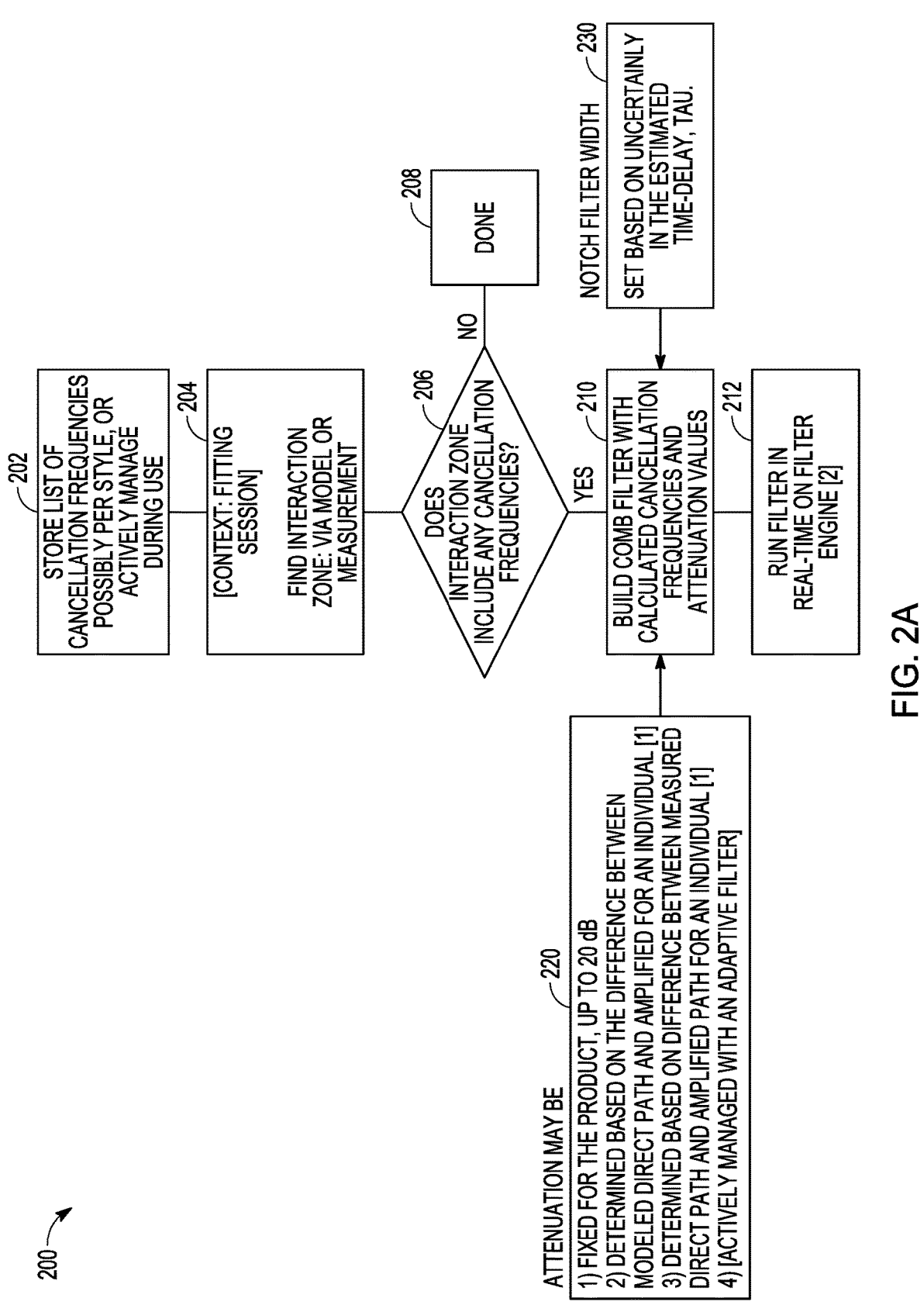
FIG. 2A illustrates a flow diagram for a method for reducing comb filtering for a hearing device, according to various examples of the present subject matter.

FIG. 2A illustrates a flow diagram for a method 200 for reducing comb filtering for a hearing device, according to various examples of the present subject matter. At step 202, the system determines or stores a list of cancellation frequencies for hearing devices. The cancellation frequencies may be determined based on the type or style of hearing device, or actively managed during use of the hearing device, through calculation based on effective time delay. The cancellation frequencies are a subset of the frequencies over which the aided and direct (or unaided) paths overlap, in various examples. At step 204, one or more interaction regions, or frequency ranges over which the aided path is within a predetermined amount of the direct path, may be determined. In some examples, the interaction regions are determined using a model of hearing device response. In other examples, the interaction regions are determined using measurements of the hearing device response. At step 206, a determination is made whether the interaction regions include any of the cancellation frequencies. This determination may be accomplished using a comparison of the interaction regions to the cancellation frequencies, in various examples. If not, the method concludes at step 208. If the interaction regions include one or more of the cancellation frequencies, a filter is constructed using the one or more of the cancellation frequencies and one or more attenuation values, at step 210.

As shown in step 220, the attenuation values may be fixed for the particular hearing device (up to 20 dB for example), or determined based on a difference between a modeled direct path and amplified path for a wearer, or determined based on a difference between a measured direct path and amplified path for the wearer, or actively managed using one or more adaptive filters. In various examples, the attenuation depends on the fitting of the hearing device. Any combination of attenuation value determination may be used without departing from the scope of the present subject matter. As shown in step 230, the filter may have a notch filter width that is set based on an uncertainty in an estimated time delay (tau(f)), in various examples. Thus, if uncertainty is increased, the notch filter has an increased width, in some examples.

Figure 2B:
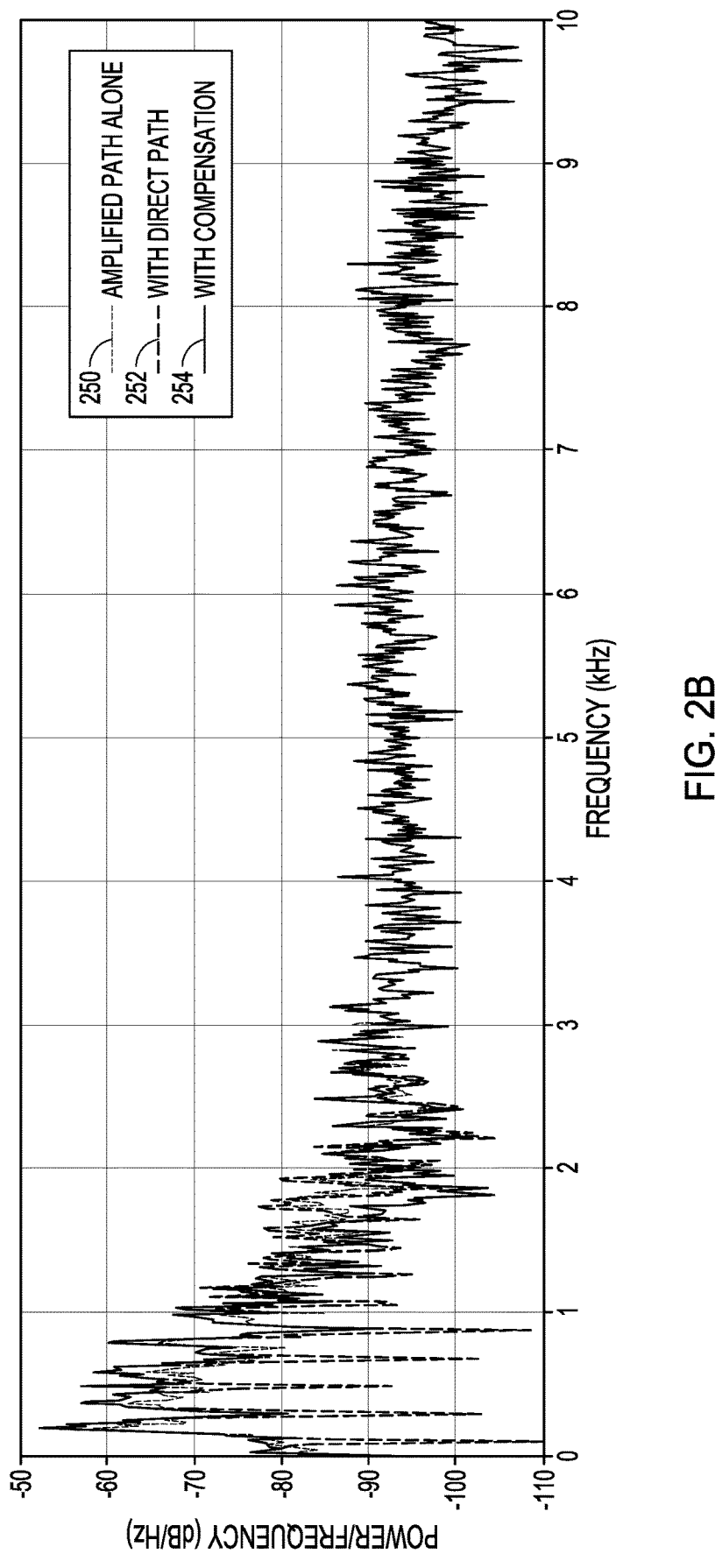
FIG. 2B illustrates a graphical diagram showing the reduction of comb filtering for a hearing device using the method of FIG. 2A, according to various examples of the present subject matter.

At step 212, the constructed filters are run in real time on a digital signal processor. In some examples, the processor may run on a hearing device and applies the filter to the amplified path. FIG. 2B illustrates a graphical diagram showing the reduction of comb filtering for a hearing device using the method of FIG. 2A, according to various examples of the present subject matter. The diagram shows the amplified path power 250, the combined amplified and direct path power 252, and the compensated combined path power 254, in one example.

In various examples, the present system determines the effective delay between the aided and direct paths, which is specific to the hearing aid model. The effective delay is a function of (i) the device geometry (specifically the relative locations of the microphones and receiver with respect to the eardrum) and (ii) the device's processing delay, or the time required for the device to process the signals coming into its microphones to generate the amplified signal at the receiver. In various examples, cancellation frequencies may be calculated using the effective delay. The present system compares the aided gain with the direct path gain for the particular fitting, by using an average acoustic conversion model or custom measurements in various examples. According to various examples, the present system determines one or more spectral interaction regions, or the frequency range over which the aided path is expected to be within +/−X dB of the direct path. In some examples, X may be between 6 and 20 dB. Other values of X may be used without departing from the scope of the present subject matter. The spectral interaction regions may be dependent on vent characteristics including insertion loss, in various examples. The present system constructs a filter/parameter set (depending on implementation) to reduce by Y dB, the gain of the amplified signal at the cancellation frequencies that fall within the spectral interaction regions, in various examples. In one example, a value of Y may be set to 2*X where X is defined above. In another example, the value of Y may be set to X+D, where D is the difference between the amplified path gain and the direct path gain. Other values of Y may be used without departing from the scope of the present subject matter.

Figure 3A:
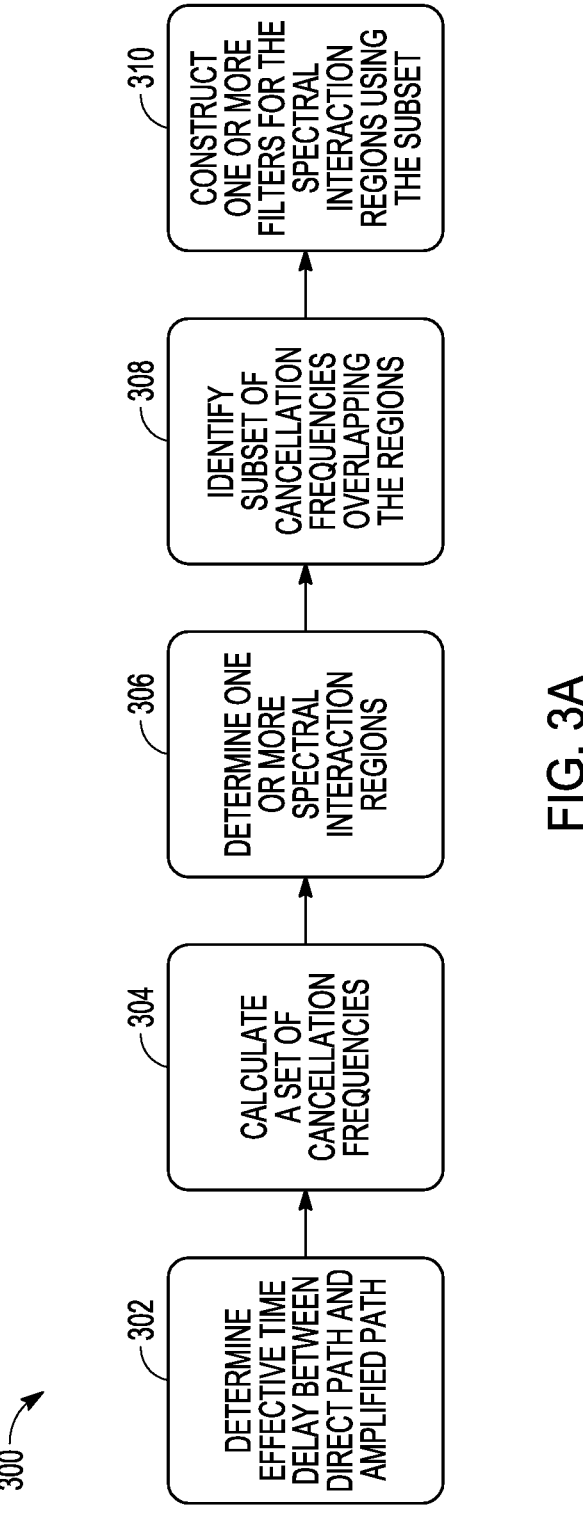

FIGS. 3A-3B illustrate flow diagrams of methods for reducing comb filtering for hearing device applications, according to various examples of the present subject matter. In FIG. 3A, a method includes determining effective time delay between a direct path and an amplified path for a wearer of a hearing device, at step 302, and calculating a set of cancellation frequencies using the delay at step 304. The cancellation frequencies may be determined based on the type or style of hearing device, or actively managed during use of the hearing device, through calculation based on effective time delay. The cancellation frequencies are frequencies at which the aided and unaided paths overlap, in various examples. The method 300 further includes determining one or more spectral interaction regions based on vent in and vent out responses, at step 306. At step 308, a subset of cancellation frequencies within the spectral interaction regions are identified, in various examples. At step 310, one or more filters are constructed to mitigate comb filtering for the wearer of the hearing device. Filter parameters for digital signal processing may be derived from applying a calculated or predetermined attenuation at one or more of the subset of cancellation frequencies, in various examples. In some examples, there may be multiple spectral interaction regions, and the multiple spectral interaction regions may include one or more subsets of the cancellation frequencies.

In various examples, information regarding modeled and measured acoustics may be derived from data from the hearing device and the individual hearing loss of the wearer. This data may be obtained during a fitting session with an audiologist, or an automated device setup procedure invoked by the wearer, in various examples. In some examples, the filter may be a finite impulse response (FIR) filter and may be implemented as a minimum-phase filter configured to minimize the additional delay into the signal path. In other examples, the filter may be implemented as a non-minimum phase design, an infinite impulse response (IIR) filter, or a frequency domain filter, and provide that the delay is not significantly increased (less than 1 msec, in an example). In various examples, the filter of the present subject matter may cause additional delay, but the delay is minimized to ensure that comb filtering is not increased.

FIG. 3B illustrates a method 350 including determining an effective time delay between a direct path from a sound source to an eardrum of a wearer of a hearing device and an amplified path from the sound source through the hearing device to the eardrum of the wearer, at step 352, and calculating a set of cancellation frequencies based at least in part on the determined effective time delay for the hearing device, at step 354. The set of cancellation frequencies may be determined based on the type or style of hearing device, or actively managed during use of the hearing device, through calculation based on effective time delay. The method 350 also includes comparing an aided gain response of the hearing device and a direct path gain response of the hearing device, at step 356, and determining one or more spectral interaction regions for the hearing device based at least in part on the comparison, at step 358. A subset of cancellation frequencies is determined by comparing the spectral interaction regions with the set of cancellation frequencies, at step 360, and a filter is constructed using the subset of cancellation frequencies and a determined attenuation configured to reduce comb filtering for the wearer of the hearing device, at step 362. Filter parameters for a processor are determined or calculated to provide a predetermined attenuation in one or more bands, with each band centered about a cancellation frequency, in various examples.

In various examples, the method may further include applying the filter to an incoming audio signal in the hearing device to reduce comb filtering for the wearer of the hearing device. The method may also include storing a list of a plurality of the cancellation frequencies in a memory, in an example. According to various examples, using the determined attenuation in step 362 includes using a fixed attenuation for the hearing device obtained from a lookup table. In some examples, the attenuation is determined based on a difference between a modeled direct path and a modeled amplified path for the hearing device. In other examples, the attenuation is determined based on a difference between a measured direct path and a measured amplified path for the wearer of the hearing device. In various examples, the determined attenuation may be actively managed using an adaptive filter. In various examples, the determined attenuation of the constructed filter depends on the fitting of the device. Constructing a filter for the spectral interaction regions (step 362) may include using a notch filter width determined based at least in part on an estimate of the effective time delay, in some examples. In various examples, determining one or more spectral interaction regions (step 358) may include comparing the aided gain response of the hearing device and the direct path gain response using a measurement. In other examples, determining one or more spectral interaction regions (step 358) may include comparing the aided gain response of the hearing device and the direct path gain response using a model.

Various aspects of the present subject matter include a system including a computing device comprising at least one processor and a data storage device in communication with the at least one processor, wherein the data storage device comprises instructions thereon that, when executed by the at least one processor, causes the at least one processor to determine an effective time delay between a direct path from a sound source to an eardrum of a wearer of a hearing device and an amplified path from the sound source through the hearing device to the eardrum of the wearer, calculate a set of cancellation frequencies based at least in part on the determined effective time delay for the hearing device, compare an aided gain response of the hearing device and a direct path gain response of the hearing device, determine one or more spectral interaction regions for the hearing device based at least in part on the comparison, determine a subset of cancellation frequencies which lie within the spectral interaction regions, and construct a filter using the subset of cancellation frequencies and a determined attenuation configured to reduce comb filtering for the wearer of the hearing device.

According to various examples, the spectral interaction regions may include frequency ranges over which sound pressure of the aided path is within a predetermined range of sound pressure of the direct path. In some examples, the determined attenuation may be set to the predetermined gain amount. The predetermined gain amount may be device specific for the hearing device, in some examples. In various examples, the determined attenuation may be based on a model of the direct path for the wearer, and may also be dependent on hearing aid fitting, as hearing loss informs vent choice which changes direct path gain. In addition, hearing loss informs the prescribed gain, which changes the aided gain. According to various examples, the filter may be a FIR filter, a minimum-phase filter, an IIR filter, and/or a frequency domain filter. Other types of filters may be used without departing from the scope of the present subject matter.

In various examples, the present system may be implemented using a high resolution filter bank. In some examples, the present system may be implemented using a static (FIR or IIR) digital notch filter, including one or more notches in the frequency response, where the frequency of each notch is chosen to match the comb filtering notches caused by the path interaction, and the Q factor is chosen to reflect uncertainty in the estimation of the notch frequencies and filter design constraints. In further examples, the present system may be implemented using an adaptive digital notch filter including adaptive notch frequencies and Q factors. The filter or high-resolution filter bank may include low delay, in various examples. In one example, a low delay static filter could be determined using minimum-phase filter design. In various examples, the present system may also slightly decrease the gain in additive regions (the regions where the amplified path and direct path constructively combine).

The present subject matter provides several benefits over previous methods of addressing comb filtering in hearing devices. One previous method was to broadly reduce amplified path gain at lower frequencies, however this limits low frequency output and contributes to a thin sound for the hearing device. Another previous method included occluding the ear canal, however occlusion is uncomfortable for extended wearing and unsuitable for many hearing device wearers. A further previous method was to provide significantly more acoustic output power at low frequencies, so that the direct path is dominated by the amplified path. However, providing significantly more output at low frequencies is not possible with small balanced armature receivers without severe signal distortion. Yet another previous method included using a zero or low delay, however reduced latency processing requires more computational power and therefore increased power consumption. Furthermore, decreasing delay may significantly decrease frequency resolution of the filter bank. An additional previous method included applying active noise control to cancel the direct path in the ear canal at low frequencies. However, if the device has significant acoustic leakage, such as a large vent or open ear bud, active noise control performance is degraded at low frequencies. Furthermore, it is difficult for active noise control to effectively control higher frequencies for the device. The present subject matter solves these problems by specifically targeting frequencies of overlap, and provides a robust solution that does not cause missed fitting targets and does not require hardware changes or excessive processing power.

In various examples, the present system determines frequencies where direct and amplified paths of a hearing device interlap and cause nulls, and uses a filter to decrease gain for the device. In some examples, directionality of sound may be detected and used to determine filter coefficients for reducing comb filtering for the device. In one example, the system reduces the amplified path for a hearing device in a subset of frequency bands within a determined frequency region range, where the amplified path is within a selected amount of the direct path. Some hearing devices operate with a linear or non-linear group delay, in various examples, The present subject matter may use a fixed delay or calculate the delay using an adaptive estimate, in various examples. In various examples, the present subject matter determines delay, overlap and filter settings during fitting of the device. In other examples, the present subject matter determines delay, overlap and filter settings adaptively during use of the device. According to various examples, the filter size may be the same for all overlapping frequencies. In other examples, the filter size may be different for different signals in the spectral interaction regions. The present system uses a notch filter to reduce the amplified path, in various examples.

In embodiments with adaptive processing, the present subject matter may be used for open fitting situations in which there is a high risk of background noise that may disturb accuracy of measurement. The present system provides for adaptive updating of the comb filtering reduction during runtime, in some examples. The present system may be used with multiple receiver systems, in one example. In various examples, the present algorithm can be wholly or partially implemented within firmware of a hearing device. Other parameters and/or operational characteristics of the hearing device besides those mentioned herein may be adjusted (or recommended to be adjusted) without departing from the scope of the present subject matter.

The hearing device also may include a wireless transceiver configured to communicate with the external device, in various examples. The wireless transceiver may include a Bluetooth® or Bluetooth® Low Energy (BLE) transceiver. Other types of wireless transceivers (or transmitters and receivers) may be used without departing from the scope of the present subject matter. In various examples, data is logged in an external storage location. The external storage location may include cloud storage, but other types of storage locations may be used without departing from the scope of the present subject matter. In various examples, the external device includes a smart phone or other computing device. Alternatively or additionally, the hearing device includes a hearing aid or other ear worn device, in various examples. The user's data and statistics are stored both on the hearing device and in a remote storage location, in various examples.

In binaural environments, the hearing device may be configured to communicate with a second hearing device (such as in the opposite ear of the user) to coordinate adjustments and recommendations between left and right devices. Alternatively or additionally, each device performs reduction of comb filtering separately. Alternatively or additionally, one device acts as a master device to control adjustments and recommendations for the other device. Alternatively or additionally, the device communicates with a separate body worn device to provide processing of the methods of the present subject matter, with or without communicating with the external device.

Figure 4:
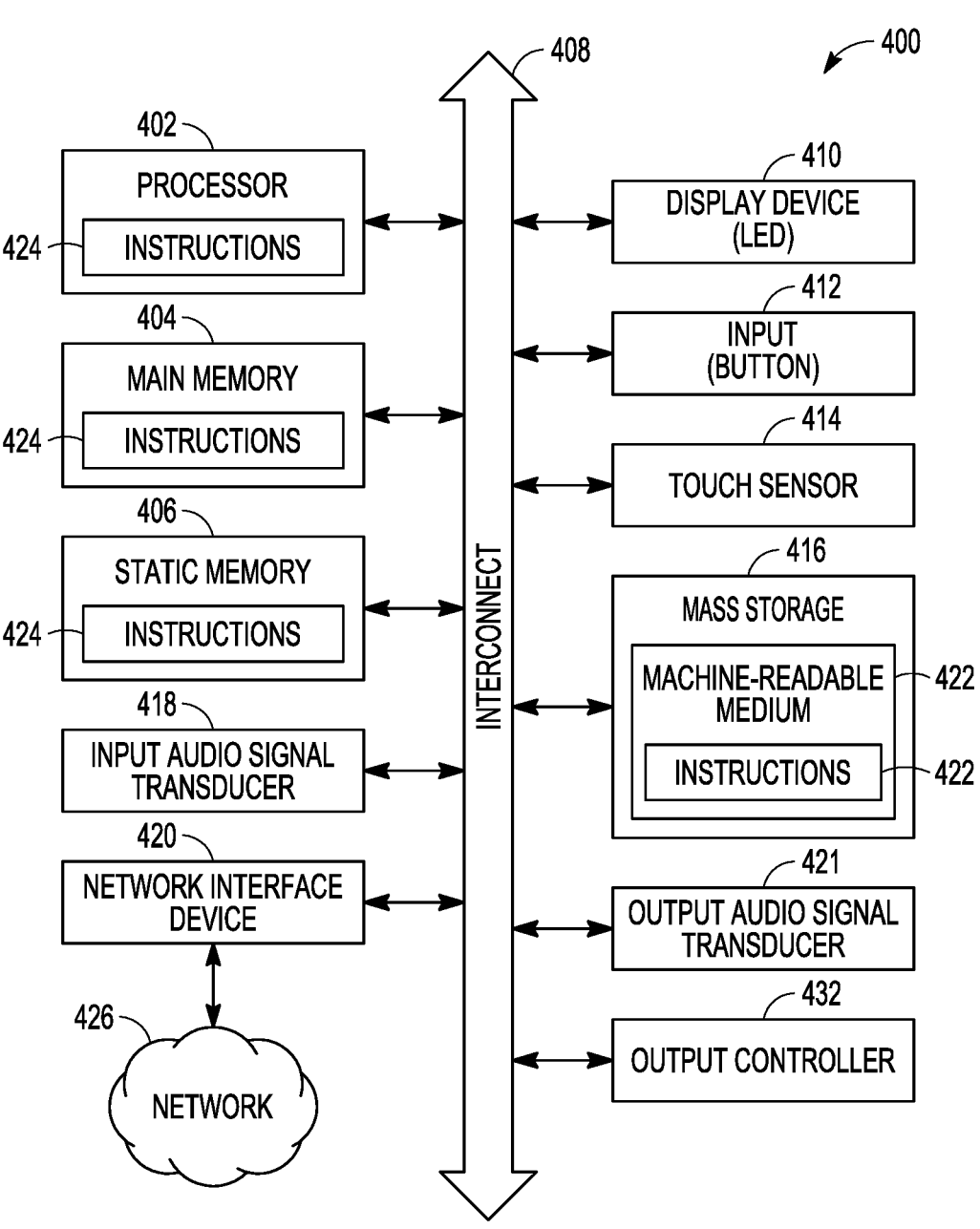
FIG. 4 illustrates a block diagram of an example machine upon which any one or more of the techniques discussed herein may perform.

FIG. 4 illustrates a block diagram of an example machine 400 upon which any one or more of the techniques (e.g., methodologies) discussed herein may perform. Alternatively or additionally, the machine 400 may operate as a standalone device or may be connected (e.g., networked) to other machines. In a networked deployment, the machine 400 may operate in the capacity of a server machine, a client machine, or both in server-client network environments. In an example, the machine 400 may act as a peer machine in peer-to-peer (P2P) (or other distributed) network environment. The machine 400 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Machine (e.g., computer system) 400 may include a hardware processor 402 (e.g., a central processing unit (CPU), a digital signal processor (DSP), a hardware processor core, or any combination thereof), a main memory 404 and a static memory 406, some or all of which may communicate with each other via an interlink (e.g., bus) 408. The machine 400 may further include a display device 410, and an input 412 including buttons, knobs, etc., and/or a touch sensor 414. The machine 400 may additionally include a storage device (e.g., SD card) 416, one or more input audio signal transducers 418 (e.g., microphone), a network interface device 420, and one or more output audio signal transducer 421 (e.g., speaker). The machine 400 may include an output controller 432, such as a serial (e.g., I2C), parallel, or other wired or wireless (e.g., infrared (IR), near field communication (NFC), etc.).

The storage device 416 may include a machine readable medium 422 on which is stored one or more sets of data structures or instructions 424 (e.g., software) embodying or utilized by any one or more of the techniques or functions described herein. The instructions 424 may also reside, completely or at least partially, within the main memory 404, within static memory 406, or within the hardware processor 402 during execution thereof by the machine 400. In an example, one or any combination of the hardware processor 402, the main memory 404, the static memory 406, or the storage device 416 may constitute machine readable media.

While the machine readable medium 422 is illustrated as a single medium, the term "machine readable medium" may include a single medium or multiple media (e.g., a centralized or distributed database, and/or associated caches and servers) configured to store the one or more instructions 424.

The term "machine readable medium" may include any medium that is capable of storing, encoding, or carrying instructions for execution by the machine 400 and that cause the machine 400 to perform any one or more of the techniques of the present disclosure, or that is capable of storing, encoding or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 42 may further be transmitted or received over a communications network 426 using a transmission medium via the network interface device 420 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, among others. In an example, the network interface device 420 may include one or more physical jacks (e.g., Ethernet, coaxial, or phone jacks) or one or more antennas to connect to the communications network 426. In an example, the network interface device 420 may include a plurality of antennas to communicate wirelessly using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 400, and includes digital or analog communications signals or other intangible medium to facilitate communication of such software.

Various examples of the present subject matter support wireless communications with a hearing device. In various examples the wireless communications may include standard or nonstandard communications. Some examples of standard wireless communications include link protocols including, but not limited to, Bluetooth™ and Bluetooth™ Low Energy (BLE). Such protocols support radio frequency communications and some support infrared communications while others support NFMI. Although the present system is demonstrated as a radio system, it is possible that other forms of wireless communications may be used such as ultrasonic, optical, infrared, and others. It is understood that the standards which may be used include past and present standards. It is also contemplated that future versions of these standards and new future standards may be employed without departing from the scope of the present subject matter.

The wireless communications support a connection from other devices. Such connections include, but are not limited to, one or more mono or stereo connections or digital connections having link protocols including, but not limited to Bluetooth™ and Bluetooth™ Low Energy (BLE), or any other streaming interface. In various examples, such connections include all past and present link protocols. It is also contemplated that future versions of these protocols and new future standards may be employed without departing from the scope of the present subject matter.

Hearing assistance devices typically include at least one enclosure or housing, a microphone, hearing assistance device electronics including processing electronics, and a speaker or "receiver." Hearing assistance devices may include a power source, such as a battery. In various examples, the battery is rechargeable. In various examples multiple energy sources are employed. It is understood that in various examples the microphone is optional. It is understood that in various examples the receiver is optional. It is understood that variations in communications protocols, antenna configurations, and combinations of components may be employed without departing from the scope of the present subject matter. Antenna configurations may vary and may be included within an enclosure for the electronics or be external to an enclosure for the electronics. Thus, the examples set forth herein are intended to be demonstrative and not a limiting or exhaustive depiction of variations.

It is understood that digital hearing assistance devices include a processor. In digital hearing assistance devices with a processor, programmable gains may be employed to adjust the hearing assistance device output to a wearer's particular hearing impairment. The processor may be a digital signal processor (DSP), microprocessor, microcontroller, other digital logic, or combinations thereof. The processing may be done by a single processor, or may be distributed over different devices. The processing of signals referenced in this application may be performed using the processor or over different devices. Processing may be done in the digital domain, the analog domain, or combinations thereof. Processing may be done using subband processing techniques. Processing may be done using frequency domain or time domain approaches. Some processing may involve both frequency and time domain aspects. For brevity, in some examples drawings may omit certain blocks that perform frequency synthesis, frequency analysis, analog-to-digital conversion, digital-to-analog conversion, amplification, buffering, and certain types of filtering and processing. In various examples of the present subject matter the processor is adapted to perform instructions stored in one or more memories, which may or may not be explicitly shown. Various types of memory may be used, including volatile and nonvolatile forms of memory. In various examples, the processor or other processing devices execute instructions to perform a number of signal processing tasks. Such examples may include analog components in communication with the processor to perform signal processing tasks, such as sound reception by a microphone, or playing of sound using a receiver (i.e., in applications where such transducers are used). In various examples of the present subject matter, different realizations of the block diagrams, circuits, and processes set forth herein may be created by one of skill in the art without departing from the scope of the present subject matter.

It is further understood that different hearing devices may embody the present subject matter without departing from the scope of the present disclosure. The devices depicted in the figures are intended to demonstrate the subject matter, but not necessarily in a limited, exhaustive, or exclusive sense. It is also understood that the present subject matter may be used with a device designed for use in the right ear or the left ear or both ears of the wearer.

The present subject matter is demonstrated for hearing devices, including hearing assistance devices, including but not limited to, behind-the-ear (BTE), in-the-ear (ITE), in-the-canal (ITC), receiver-in-canal (RIC), invisible-in-canal (IIC) or completely-in-the-canal (CIC) type hearing assistance devices. It is understood that behind-the-ear type hearing assistance devices may include devices that reside substantially behind the ear or over the ear. Such devices may include hearing assistance devices with receivers associated with the electronics portion of the behind-the-ear device, or hearing assistance devices of the type having receivers in the ear canal of the user, including but not limited to receiver-in-canal (RIC) or receiver-in-the-ear (RITE) designs. The present subject matter may also be used in hearing assistance devices generally, such as bone-conduction hearing devices. The present subject matter may also be used in deep insertion devices having a transducer, such as a receiver or microphone. The present subject matter may be used in bone conduction hearing devices, in some examples. The present subject matter may be used in devices whether such devices are standard or custom fit and whether they provide an open or an occlusive design. It is understood that other hearing devices not expressly stated herein may be used in conjunction with the present subject matter.

This application is intended to cover adaptations or variations of the present subject matter. It is to be understood that the above description is intended to be illustrative, and not restrictive. The scope of the present subject matter should be determined with reference to the appended claims, along with the full scope of legal equivalents to which such claims are entitled.

What is claimed is:

1. A method comprising:

determining an effective time delay, as a function of frequency, between a direct path from a sound source to an eardrum of a wearer of a hearing device and an amplified path from the sound source through the hearing device to the eardrum of the wearer;

calculating a set of cancellation frequencies based at least in part on the determined effective time delay for the hearing device;

comparing an aided gain response of the hearing device and a real-ear occluded gain response of the hearing device;

determining one or more spectral interaction regions for the hearing device based at least in part on the comparison;

determining a subset of cancellation frequencies by comparing the one or more spectral interaction regions with the set of cancellation frequencies; and constructing a filter using the subset of cancellation frequencies and a determined attenuation configured to reduce comb filtering for the wearer of the hearing device; and applying the filter to an incoming audio signal in the hearing device to reduce comb filtering for the wearer of the hearing device.

2. The method of claim 1, wherein the hearing device is a hearing aid.

3. The method of claim 1, further comprising:

storing a list of a plurality of the set of cancellation frequencies in a memory.

4. The method of claim 1, wherein using the determined attenuation including using a fixed attenuation for the hearing device obtained from a lookup table.

5. The method of claim 1, wherein using the determined attenuation including determining attenuation based on a difference between a modeled direct path and a modeled amplified path for the hearing device.

6. The method of claim 1, wherein using the determined attenuation including determining attenuation based on a difference between a measured direct path and a measured amplified path for the wearer of the hearing device.

7. The method of claim 1, wherein using the determined attenuation including actively managing the determined attenuation using one or more adaptive filters.

8. The method of claim 1, wherein constructing a filter includes using a notch filter width determined based at least in part on uncertainty of an estimate of the effective time delay.

9. The method of claim 1, wherein determining one or more spectral interaction regions includes comparing the aided gain response of the hearing device and the real-ear occluded gain response using a measurement.

10. The method of claim 1, wherein determining one or more spectral interaction regions includes comparing the aided gain response of the hearing device and the real-ear occluded gain response using a model.

11. A system comprising:

a computing device comprising at least one processor and a data storage device in communication with the at least one processor, wherein the data storage device comprises instructions thereon that, when executed by the at least one processor, causes the at least one processor to:

determine an effective time delay, as a function of frequency, between a direct path from a sound source to an eardrum of a wearer of a hearing device and an amplified path from the sound source through the hearing device to the eardrum of the wearer;

calculate a set of cancellation frequencies based at least in part on the determined effective time delay for the hearing device;

compare an aided gain response of the hearing device and a real-ear occluded gain response of the hearing device;

determine one or more spectral interaction regions for the hearing device based at least in part on the comparison;

determine a subset of cancellation frequencies by comparing the one or more spectral interaction regions with the set of cancellation frequencies;

construct a filter using the subset of cancellation frequencies and a determined attenuation configured to reduce comb filtering for the wearer of the hearing device; and apply the filter to an incoming audio signal in the hearing device to reduce comb filtering for the wearer of the hearing device.

12. The system of claim 11, wherein the one or more spectral interaction regions include frequency ranges over which gain of the amplified path is within a predetermined gain range of gain of the direct path.

13. The system of claim 12, wherein the determined attenuation is set by a rule based on the gain of the amplified path, the gain of the direct path and the predetermined gain range.

14. The system of claim 13, wherein the predetermined gain range is device specific for the hearing device.

15. The system of claim 12, wherein the determined attenuation is based on a model of the direct path for the wearer.

16. The system of claim 11, wherein the filter is a finite impulse response (FIR) filter.

17. The system of claim 11, wherein the filter is minimum-phase filter.

18. The system of claim 11, wherein the filter is an infinite impulse response (IIR) filter.

19. The system of claim 11, wherein the filter is a frequency domain filter.

20. The system of claim 11, wherein the hearing device is a hearing aid.

* * * * *